(12) United States Patent
Dyer et al.

(10) Patent No.: US 9,948,314 B2
(45) Date of Patent: *Apr. 17, 2018

(54) VAPOR CELL AND METHOD FOR MAKING SAME

(71) Applicant: Texas Instruments Incorporated, Dallas, TX (US)

(72) Inventors: Terrence Edward Dyer, North Ayrshire (GB); Nathan Luke Brockie, Edinburgh (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/467,529

(22) Filed: Mar. 23, 2017

(65) Prior Publication Data

US 2017/0194977 A1 Jul. 6, 2017

Related U.S. Application Data

(63) Continuation of application No. 14/672,493, filed on Mar. 30, 2015, now Pat. No. 9,639,062.

(51) Int. Cl.
*G04F 5/14* (2006.01)
*H01S 1/06* (2006.01)
*H03L 7/26* (2006.01)
*G01R 33/02* (2006.01)

(52) U.S. Cl.
CPC ............... *H03L 7/26* (2013.01); *G01R 33/02* (2013.01); *G04F 5/14* (2013.01); *H01S 1/06* (2013.01)

(58) Field of Classification Search
CPC ..... G04F 5/14; G04F 5/145; H01S 1/06; H03L 7/26
See application file for complete search history.

(56) References Cited

U.S. PATENT DOCUMENTS

| 8,680,854 | B2 | 3/2014 | Dyer et al. |
| 8,836,327 | B2 | 9/2014 | French et al. |
| 8,906,470 | B2 | 12/2014 | Overstolz et al. |
| 9,201,404 | B2 | 12/2015 | Harasaka et al. |

(Continued)

OTHER PUBLICATIONS

Overstolz, T., et al. "Wafer scale fabrication of highly integrated rubidium vapor cells." Micro Electro Mechanical Systems (MEMS), 2014 IEEE 27th International Conference on. IEEE, 2014.

(Continued)

*Primary Examiner* — Ryan Johnson
(74) *Attorney, Agent, or Firm* — Jacqueline J. Garner; Charles A. Brill; Frank D. Cimino

(57) ABSTRACT

Vapor cells and methods for making the same are presented, in which a cell cavity is completely filled with aqueous alkali metal azide solution and the solution is dried at a controlled evaporation rate to substantially maintain edge contact pinning at an interface with the cavity sidewall to promote preferential evaporation in the center and outward capillary flow from an unpinned air-fluid interface toward the sidewall to form crystallized alkali metal material at the sidewall while inhibiting drying of dispersed aqueous solution on a transparent cavity bottom to provide substantially unrestricted passage of light through the cavity for atomic clock and other applications.

18 Claims, 12 Drawing Sheets

(56) References Cited

U.S. PATENT DOCUMENTS

| | | |
|---|---|---|
| 9,639,062 B2 * | 5/2017 | Dyer .................... G04F 5/14 |
| 2005/0007118 A1 | 1/2005 | Kitching et al. |
| 2013/0015850 A1 | 1/2013 | Lindorfer et al. |
| 2013/0147472 A1 | 6/2013 | French et al. |
| 2013/0176703 A1 | 7/2013 | Hopper et al. |
| 2015/0001694 A1 | 1/2015 | Hopper et al. |
| 2015/0027908 A1 | 1/2015 | Parsa et al. |
| 2015/0028866 A1 | 1/2015 | Parsa et al. |
| 2015/0084707 A1 | 3/2015 | Maki |
| 2015/0244382 A1 | 8/2015 | Ishihara |

OTHER PUBLICATIONS

Liew, et al. "Wafer-level filling of microfabricated atomic vapor cells based on thin-film deposition and photolysis of cesium azide." Applied physics letters 90.11 (2007): 114106.

Deegan, et al., "Capillary Flow as the Cause of Ring Stains from Dried Liquid Drops", Letters to Nature, Nature, vol. 389, Oct. 23, 1997, Macmillan Publishers Ltd., pp. 827-829.

Gelderblom, "Fluid Flow in Drying Drops", Henneke Gelderblom, Physics of Fluids, Univ. of Twente, Enschede, The Netherlands, Apr. 19, 2013, 153 pgs.

Hasegawa, et al., "Microfabrication of cesium vapor cells with buffer gas for MEMS atomic clocks", Sensors and Actuators A 167 (2011): Physical, Elsevier, pp. 594-601.

Woetzel, et al., "Microfabricated Atomic Vapor Cell Arrays for Magnetic Field Measurements", Review of Scientific Instruments 82, 033111 (2011, downloaded May 26, 2011 to 129.215.149.92), American Institute of Physics, 4 pgs.

* cited by examiner

VAPOR CELL AND METHOD FOR MAKING SAME

REFERENCE TO RELATED APPLICATIONS

This application is a continuation of U.S. Nonprovisional patent application Ser. No. 14/672,493, filed Mar. 30, 2015, the following U.S. patent applications are referenced: Ser. No. 14/309,966 filed Jun. 20, 2014; Ser. No. 14/309,223 filed Jun. 19, 2014; Ser. No. 14/319,310 filed Jun. 30, 2014; and Ser. No. 14/319,696 filed Jun. 30, 2014, the contents of which are herein incorporated by reference in its entirety.

FIELD OF THE INVENTION

The present disclosure relates to vapor cells and more particularly to improved vapor cells and fabrication methods.

BACKGROUND

Vapor cells or atomic vapor cells are used in the construction of atomic clocks, magnetometers, and other devices, and allow chip-scale structures with significant power consumption advantages for use in portable battery-powered devices over conventional atomic clocks. Ideally, an alkali metal gas such as Cesium (Cs) or Rubidium (Rb) is provided within a sealed cavity and a light source optically excites the alkali metal, with the frequency of electronic transition of an alkali atom having a single electron in the outer shell being used as an absolute frequency reference for generating highly accurate clock signals. Optical interrogation at different frequencies within a frequency band can be used to identify a transition frequency through absorption spectrum detection to provide an absolute frequency reference for a clock. Proper operation for atomic clock or other applications is facilitated by a clear unobstructed optical path through the vapor cell. One method of adding a controlled amount of Cs to a vapor cell is to introduce aqueous Cesium Azide ($CsN_3$) into the cell and then allow the water to evaporate leaving solid $CsN_3$ residue. After the vapor cell is sealed, UV photolysis is carried out to dissociate the $CsN_3$ residue into Cs and N2. However, conventional vapor cell fabrication techniques suffer from formation of residual alkali metal azide on the lower cell window, causing undesirable absorption and/or scattering of light during cell operation. Such $CsN_3$ or other alkali metal solids, moreover, cannot be removed from the vapor cell window by post-processing. Accordingly, a need remains for vapor cells with unobstructed optical paths for efficient identification of the alkali metal electronic transmission frequency for atomic clocks and other applications.

SUMMARY

The present disclosure provides fabrication processes or methods and vapor cell apparatus by which undesirable optical obstructions in the lower cell window can be mitigated or avoided through substantially complete filling of a cell cavity with aqueous alkali metal solution and drying the solution in a controlled environment to substantially maintain edge contact pinning of the solution at the cavity sidewall for enhanced evaporation in the unpinned center and outward capillary solution flow toward the sidewall to form crystallized alkali metal material at the sidewall while inhibiting drying of dispersed aqueous solution on the lower cell window. The resulting cell structure provides a completely or substantially unrestricted light channel through the cavity for operation in atomic clock and other applications.

In accordance with one or more aspects of the disclosure, a method is provided for fabricating a vapor cell, in which a cavity is formed between first and second sides of a substrate, and a lower window is bonded to the second side to form a cavity bottom. The cavity is filled with an aqueous solution comprising an alkali metal material, such as $CsN_3$ in one embodiment, with the solution extending to a contact line substantially at the top of the cavity sidewall or sidewalls. The method further includes drying the aqueous solution at a controlled temperature and humidity to substantially maintain edge contact pinning at a pinned fluid interface between the solution and the sidewall to promote preferential evaporation near the center of an unpinned air-fluid interface, along with outward capillary fluid flow toward the pinned fluid interface to promote drying of dispersed aqueous solution and formation of crystallized alkali metal material at or near the sidewall and to inhibit drying of dispersed aqueous solution on the cavity bottom. The method further includes bonding an upper window to the first substrate side to seal the cavity and exposing the crystallized alkali metal material to UV photolysis to form an alkali metal gas in the sealed cavity.

Further aspects of the disclosure provide a vapor cell structure comprised of a substrate with first and second sides and a cavity defined by one or sidewalls extending between the substrate sides, as well as a crystallized alkali metal material formed on all or a portion of the sidewall or sidewalls. The cell further includes a lower window forming a transparent cavity bottom substantially free of crystallized alkali metal material, an upper window to seal the cavity and form a transparent cavity top, and an alkali metal gas in the sealed cavity.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
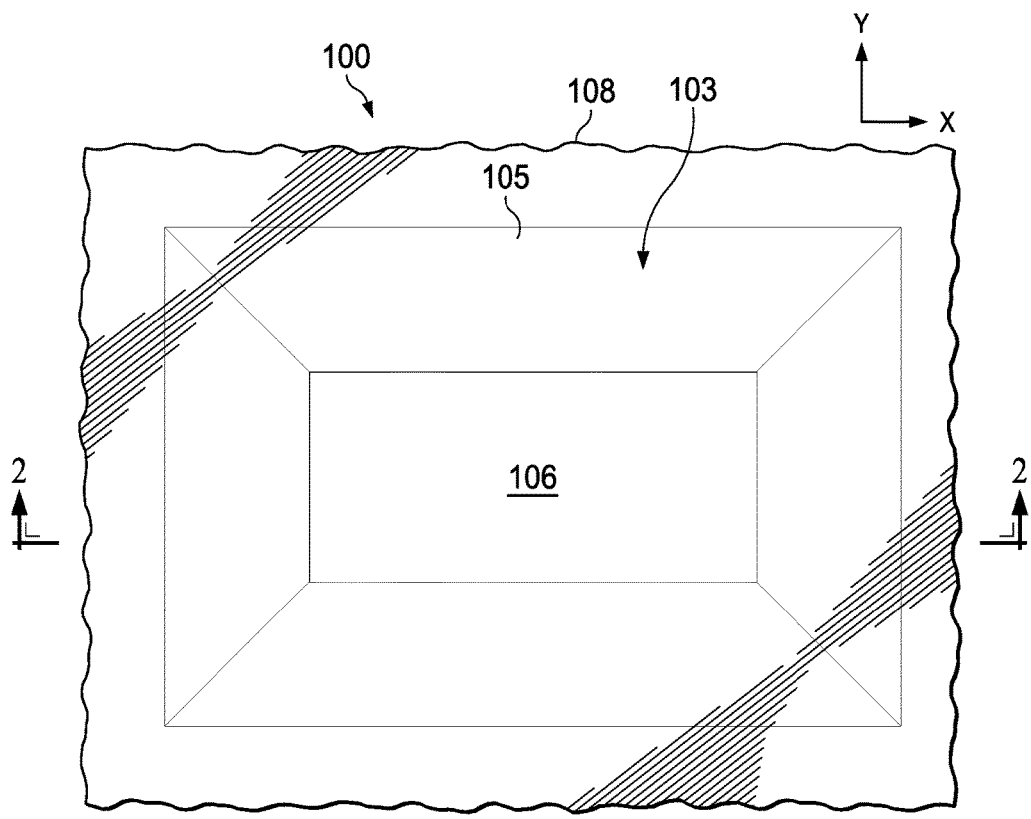
FIG. 1 is a top plan view illustrating a Cesium vapor cell in accordance with one or more aspects of the present disclosure.

One or more embodiments or implementations are hereinafter described in conjunction with the drawings, wherein like reference numerals are used to refer to like elements throughout, and wherein the various features are not necessarily drawn to scale.

Figure 2:
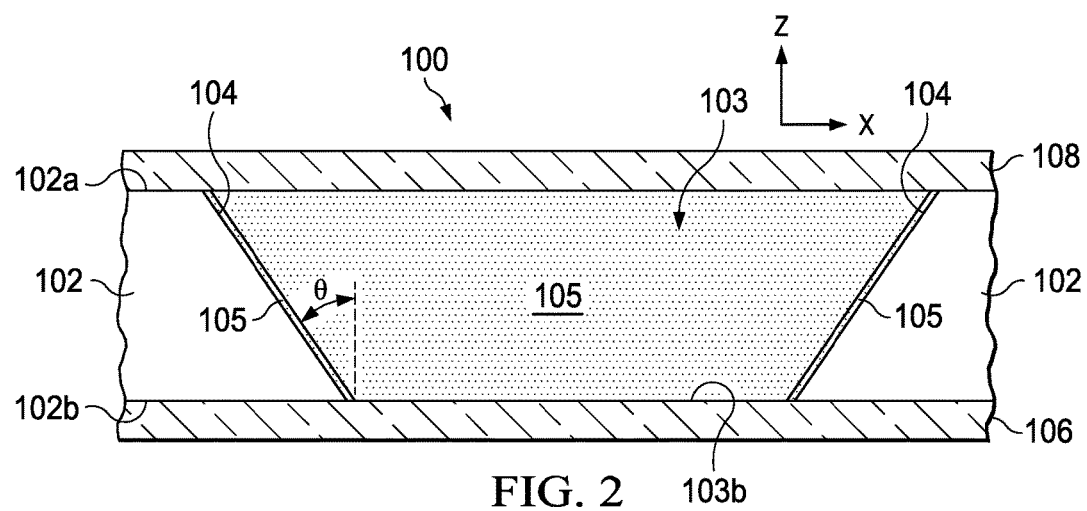
FIG. 2 is a partial sectional side elevation view of the Cesium vapor cell taken along line 2-2 in FIG. 1.

Referring initially to FIGS. 1 and 2, the present disclosure provides fabrication techniques and vapor cell structures 100 which may be employed in a variety of applications, including without limitation atomic clocks, magnetometers and the like. FIGS. 1 and 2 illustrate a Cesium vapor cell embodiment 100 having a single cavity 103 defined by sidewalls 104 formed in a silicon substrate 102 between atomically polished first and second (top and bottom) sides 102a and 102b (as shown in the sectional side view of FIG. 2 taken along line 2-2 in FIG. 1). The cell cavity 103 is further defined by a transparent first (lower) silicon glass window 106 engaging and bonded to the second side 102b to form a cavity bottom 103b, and a transparent second (upper) silicon glass window 106 engaging and bonded to the first side 102a of the substrate 102 to seal the cavity 103. The cavity 103 is defined by a single opening in the substrate 102 with four angled sidewalls 104 extending from an opening in the top side 102a to an opening in the bottom side 102b to form a trapezoidal cavity 103 in the illustrated embodiment with a rectangular shape in the X-Y plane providing an optical path along the vertical Z direction as illustrated in FIG. 2. Other embodiments are possible having one or more sidewalls 104, such as a circular cavity with a single sidewall 104, and other cavity shapes may be provided in different embodiments. In the illustrated embodiment, moreover, the sidewalls 104 are at a non-zero angle θ relative to a vertical Z axis in FIG. 2 extending between the first and second sides 102a and 102b. For example, the angle θ in the embodiment of FIG. 2 is approximately 54.74°, although angled sidewalls 104 and this particular angle value are not strict requirements of all embodiments.

In addition, as discussed further below, a crystallized alkali metal material 105 is formed on at least a portion of the sidewalls 104, and the lower window 106 forming the cavity bottom 103b is substantially free of crystallized alkali metal material 105. The cell 100, moreover, includes an alkali metal gas in the sealed cavity 103. In the illustrated embodiment, Cesium metal gas is provided in the cavity 103 as detailed further below. In other possible embodiments, other alkali metal gas may be provided in the cavity 103, including without limitation rubidium, potassium, etc. Provision of the transparent upper and lower windows 108 and 106, and the provision of the lower window 106 substantially free of crystallized alkali metal material advantageously provides a generally unobstructed optical channel for laser or other optical excitation or interaction of the alkali metal gas within the cavity 103 without undesirable optical obstructions, and the vapor cell 100 of FIGS. 1 and 2 is thus ideal for atomic clock, magnetometer, and other applications. Furthermore, the cell 100 requires only a single cavity 103 and is ideal for applications requiring low manufacturing cost and small device size.

In the illustrated embodiment, moreover, the sidewalls 104 have a surface texture that is significantly rougher than the polished surface texture of the first or top side 102a of the substrate 102. Furthermore, the sidewall texture is also significantly rougher than three upper surface of the lower silicon glass window 106 forming the cavity bottom 103b. As discussed further below, this rough sidewall texturing advantageously facilitates edge contact pinning of Cesium Azide or other alkali metal aqueous solution at or near the top of the sidewalls 104 when drying begins, so as to facilitate provision of a generally obstruction-free transparent cavity bottom 103b. In addition, as shown in FIGS. 1 and 2, the cell 100 is a single-cavity configuration with only one cavity 103, which is separated by the sidewalls 104 from any other cavity formed in the substrate 102 during fabrication, unlike dual cavity vapor cell configurations in which different materials are received in different cavities with a channel providing fluid connection of the two cavities. Accordingly, the disclosed cell design 100 is a compact device ideal for portable device applications.

Referring to FIGS. 3-14B, FIG. 3 illustrates an example fabrication process or method 200 for fabricating a vapor cell, and FIGS. 4-14B illustrate the cell 100 of FIGS. 1 and 2 undergoing various stages of fabrication according to the method 200. Although the method 200 is illustrated and described in the form of a series of acts or events, the various methods of the disclosure are not limited by the illustrated ordering of such acts or events except as specifically set forth herein. In this regard, except as specifically provided hereinafter, some acts or events may occur in different order and/or concurrently with other acts or events apart from those illustrated and described herein, and not all illustrated steps may be required to implement a process or method in accordance with the present disclosure. The illustrated process 200 begins with a silicon glass substrate 102, although other substrates can be used in different embodiments.

Figure 3:
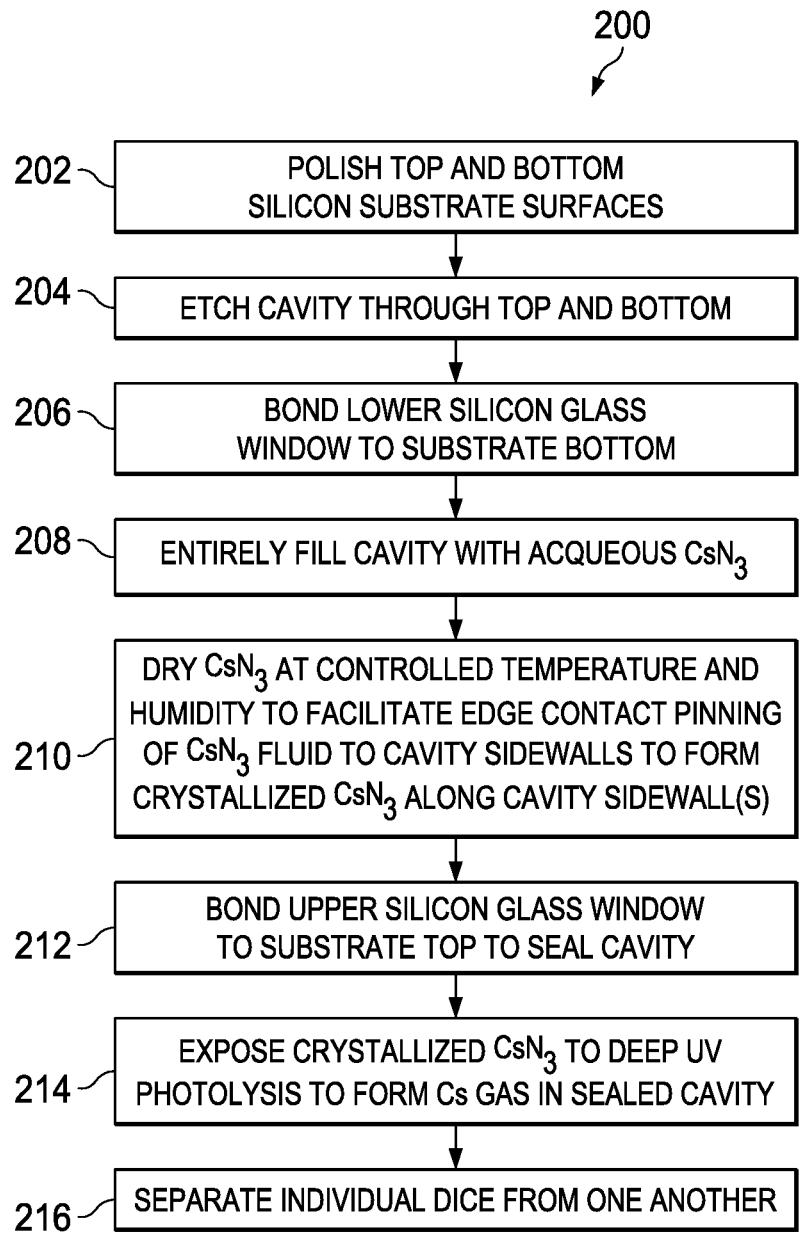
FIG. 3 is a flow diagram illustrating a method for fabricating a vapor cell in accordance with further aspects of the disclosure.
Figure 4:
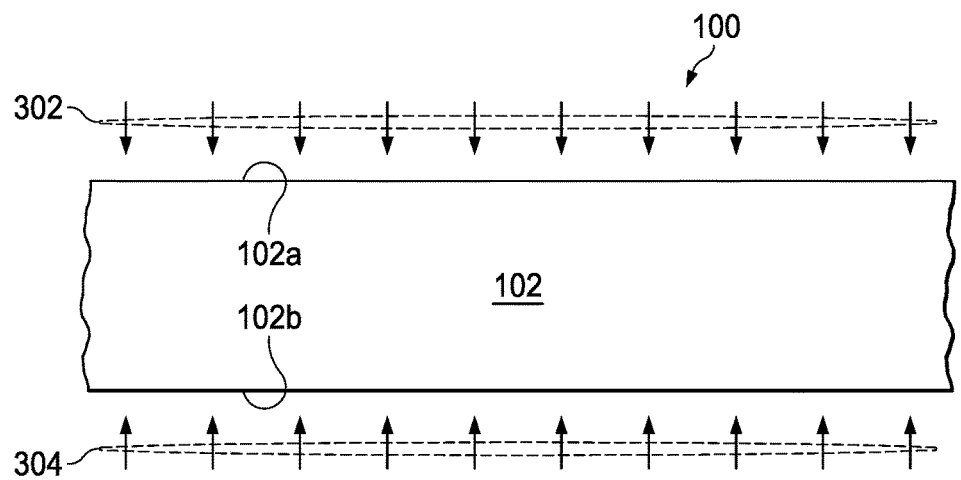
FIG. 4 is a partial side elevation view illustrating top and bottom polishing of a silicon substrate.

The process 200 begins at 202 in FIG. 3 with polishing of the top and bottom silicon substrate surfaces 102a and 102b of the substrate 102 via corresponding polishing processes 302 and 304 as shown in FIG. 4. Any suitable polishing processing steps 302 and 304 can be used at 202 in FIG. 3, whether concurrently as a single process or separately in any order to provide atomically smooth substrate surfaces 102a and 102b, where the polished top side 102a is prepared via the process 302 for eventual wafer bonding to the upper silicon glass window 108 at 212 and the process 303 provides a smooth bottom surface on the second side 102b suitable for wafer bonding to a lower silicon glass window 106 at 206.

Figure 5:
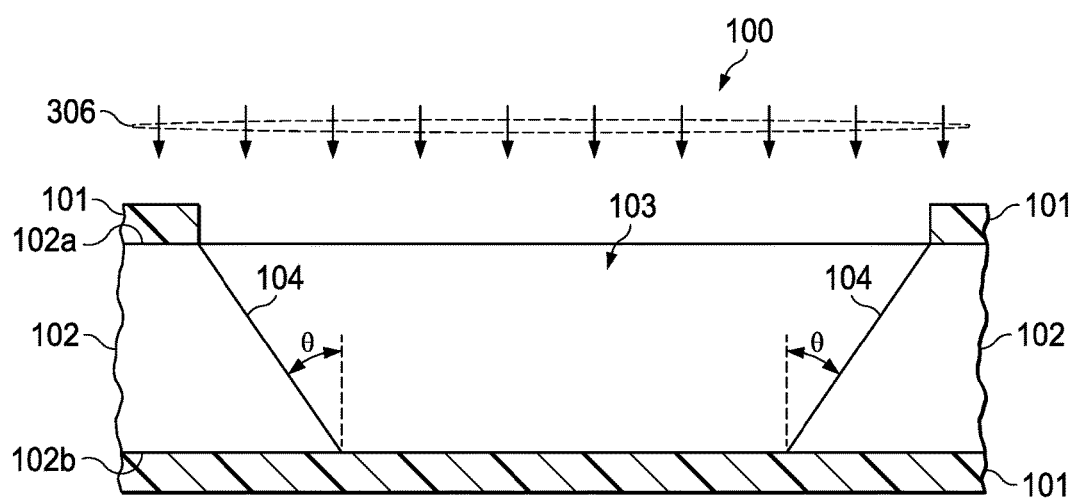
FIG. 5 is a partial side elevation view illustrating masked wet etching to form a cavity with angled sidewalls extending between the top and bottom sides of the substrate of FIG. 4.

At 204 in FIG. 3, the cavity or opening 103 is etched through the top and bottom of the substrate 102 using an anisotropic wet etch process 306 using a mask 101 as shown in FIG. 5 to form sidewalls 104 at an angle θ. Any suitable etch process 306 may be used, where anisotropic etching advantageously provides angled sidewalls 104 as shown in FIG. 5. The etch process 306, moreover, provides a surface texture on the sidewalls 104 significantly rougher than the surface texture of the polished first side 102a of the substrate 102. As discussed further below, this texture differential between the substrate top side 102a and the sidewalls 104 advantageously facilitates edge contact pinning to mitigate or avoid formation of crystallized alkali metal material on the cavity bottom 103b of the finished vapor cell 100.

Figure 6:
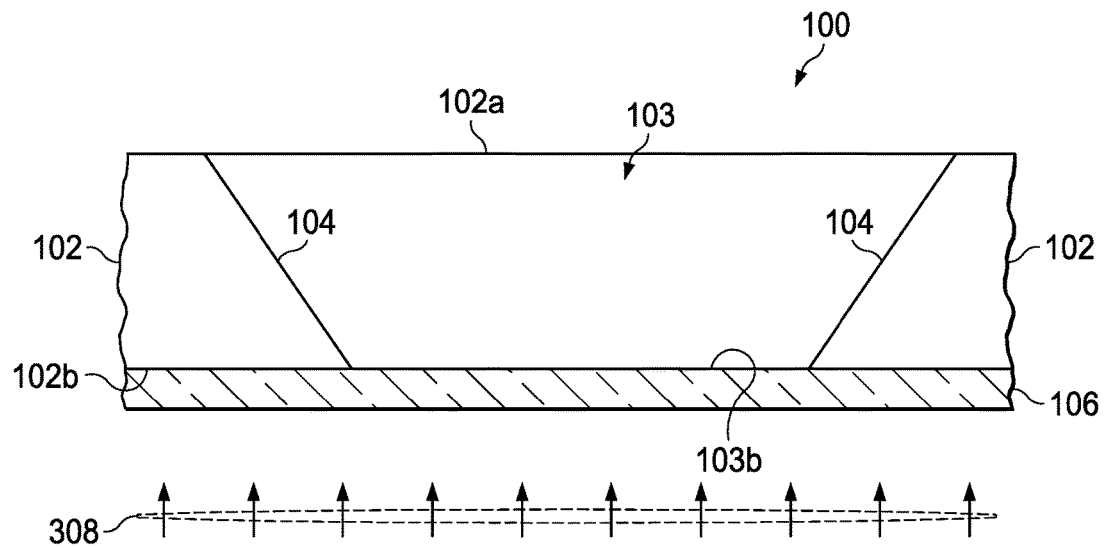
FIG. 6 is a partial side elevation view illustrating bonding of a lower window to the lower side of the substrate of FIG. 5 to form a cavity bottom.

At 206 in FIG. 3, the first or lower window 106 is bonded to the substrate second side 102b via a bonding process 308 as shown in FIG. 6. The bonded lower window 106 can be any transparent material compatible with the bonding and UV exposure process steps, and forms the cavity bottom 103b. Any suitable process 308 can be used at 206 for bonding the lower window structure 108 to the lower side 102b of the substrate 102.

Figure 7A:
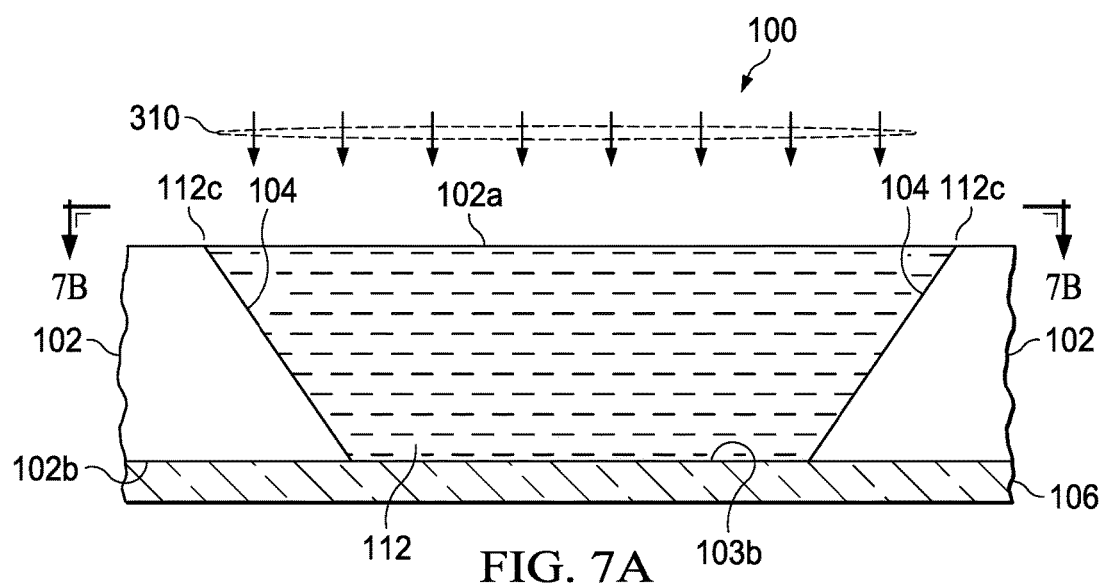
FIGS. 7A and 7B are partial side elevation and top plan views illustrating complete filling of the cavity with an alkali metal aqueous solution.
Figure 7B:
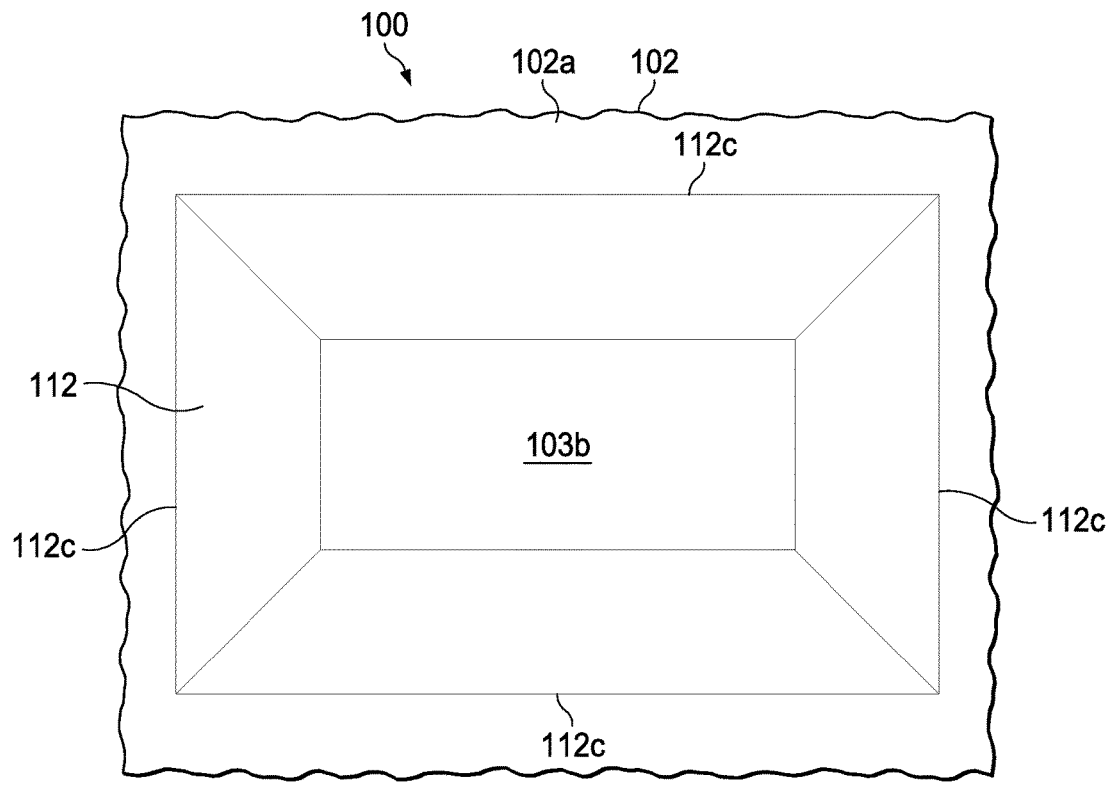
Figure 8A:
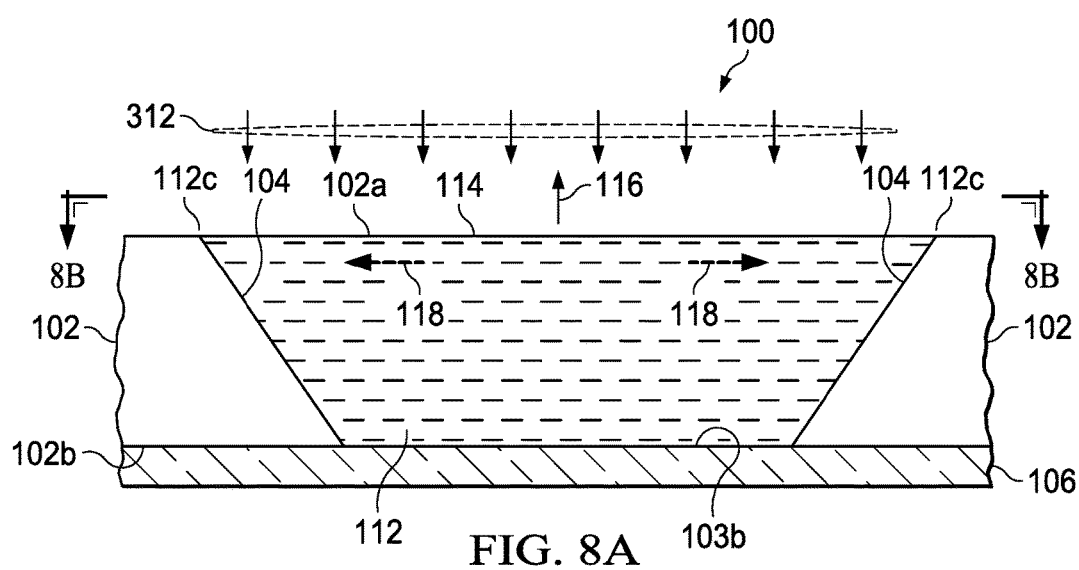
FIGS. 8A and 8B are partial side elevation and top plan views illustrating initiation of a drying process at a controlled temperature and relative humidity to provide edge contact pinning of the alkali metal aqueous solution at the cavity sidewalls and preferential evaporation at the center.
Figure 8B:
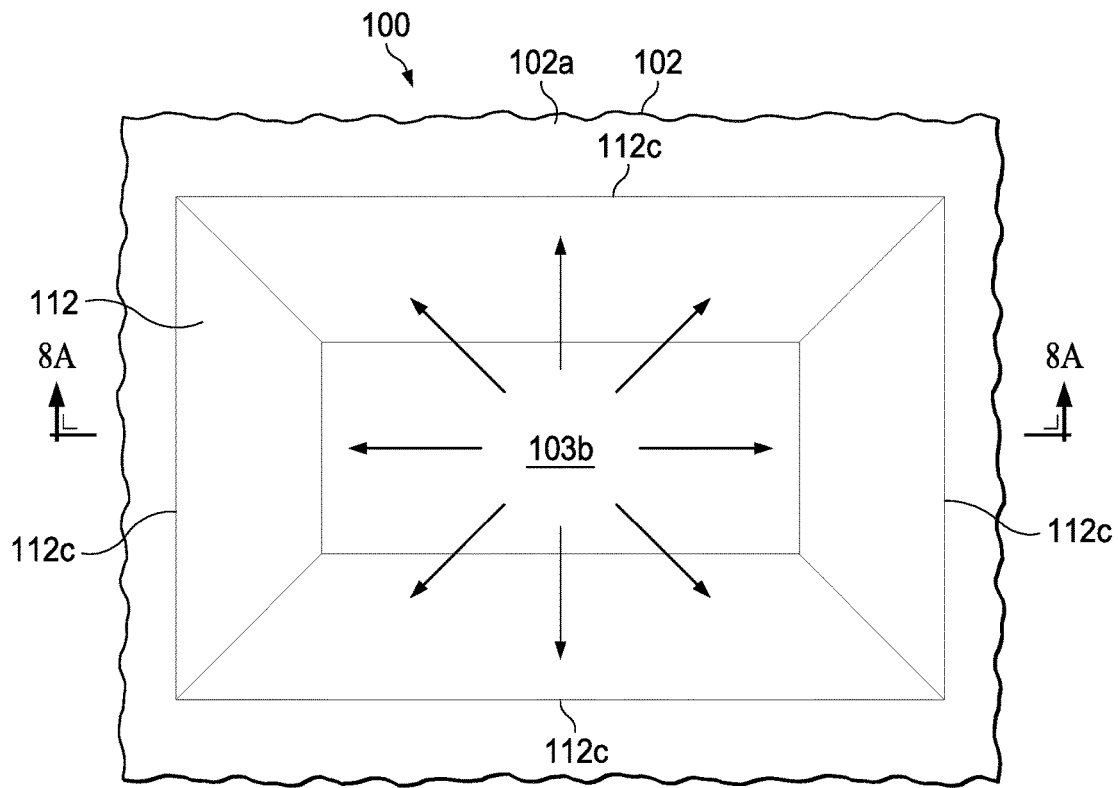

Referring also to a filling process 319 in FIGS. 7A and 7B, the cavity 103 is entirely or substantially fully filled at 208 in FIG. 3 with an alkali metal aqueous solution 112 such that the solution 112 extends to a contact line 112c substantially at a top of the cavity sidewalls 104 at or proximate to the first substrate side 102a. Any suitable process 310 can be used to dispense or otherwise introduce the solution 112 into the cavity 103 as shown in FIG. 7A, such as pouring or pressurized injection. The inventors have appreciated that increasing the volume of fluid 112 to entirely fill the cavity 103 advantageously increases the surface area contact of the solution 112 to the sidewalls 104. Moreover, the sidewalls 104 have a fairly rough texture relative to the atomically flat glass at the top side 102a of the substrate 102 due to the etch process 306 in FIG. 5 above, which enhances the strength of the fluid edge pinning at the contact line 112c. In addition, the substantially complete filling of the cavity 103 maximizes the distance between the pinned fluid interface at the line 112c and the un-pinned interface at the center of the fluid-air boundary of the solution 112. The cavity 103 need not be entirely filled in all embodiments, wherein slight underfilling is contemplated in certain embodiments.

The substantially complete cavity filling at 208 is in contrast to conventional alkali metal introduction in the fabrication of vapor cells, however, which typically involved introduction of material only at the bottom of a cavity. Any solution can be used having alkali metal in an aqueous form at 208, where the mixture process is adjusted in one implementation to target a desired final alkali metal mass for a given cell design. For example, the desired final Cs mass is set by the mixture and amount of $CsN_3$ in one embodiment at a lower concentration than would be used using conventional dispensation approaches that did not substantially fill the cavity.

Following the fluid introduction, the process 200 continues at 210 with drying of the aqueous solution 112 at a controlled temperature and humidity via a drying process 312 shown in FIGS. 8A, 9A, 10A, 11A, and 12A to substantially maintain the edge contact pinning of the aqueous solution 112 at a pinned fluid interface along the contact line 112c between the aqueous solution 112 and the sidewalls 104. The inventors have further appreciated that maintenance of the edge contact pinning of the aqueous solution 112 during the drying at 210 creates a preference for fluid loss through evaporation at and near the center of the un-pinned air-fluid interface due to increased stability at the pinned interface line 112c and random-walk molecular mechanics. The temperature and humidity controlled drying process 312 provides preferential evaporation of the aqueous solution 112 proximate the center of an unpinned air-fluid interface as well as outward capillary fluid flow of the aqueous solution 112 from the unpinned air-fluid interface 112c toward the pinned fluid interface at the contact line 112c. In addition, the process 312 promotes drying of dispersed aqueous solution 112 to form crystallized alkali metal material 120 proximate the sidewalls 104 and inhibits drying of dispersed aqueous solution 112 on the cavity bottom 103b as seen in FIGS. 8A-12B.

In certain embodiments, the drying process 312 involves controlling the evaporation rate of the aqueous solution 112 by temperature and relative humidity control of the ambient process conditions in order to maintain a non-zero lateral temperature gradient in the aqueous solution 112, where the highest temperatures are near the sidewalls 104. The fluid temperature gradient, in turn, promotes outward capillary flow of the aqueous solution 112 toward the sidewalls 104 to mitigate or avoid formation of crystallized alkali metal material 120 on the cavity bottom 103b. Unlike conventional solution drying approaches, the disclosed process 200 provides a mechanism for moving the material toward the sidewalls 104 and thus away from the cavity bottom 103b to facilitate an obstruction-free optical path in the finished vapor cell 100. As seen in the drying process progression of FIGS. 8A-12B, the solution 112 initially fills the entire cavity 103 (FIGS. 8A and 8B) with the process 312 enhancing evaporation upward from the center, shown at arrow 116 in FIG. 8A, with the lower liquid evaporation from the cavity edges along the contact line 112c being replenished by capillary outward liquid flow from the cavity interior as depicted by the dashed arrows in FIG. 8A and the outward arrows shown in FIG. 8B, thus further maintaining the contact pinning to the sidewalls 104.

Figure 9A:
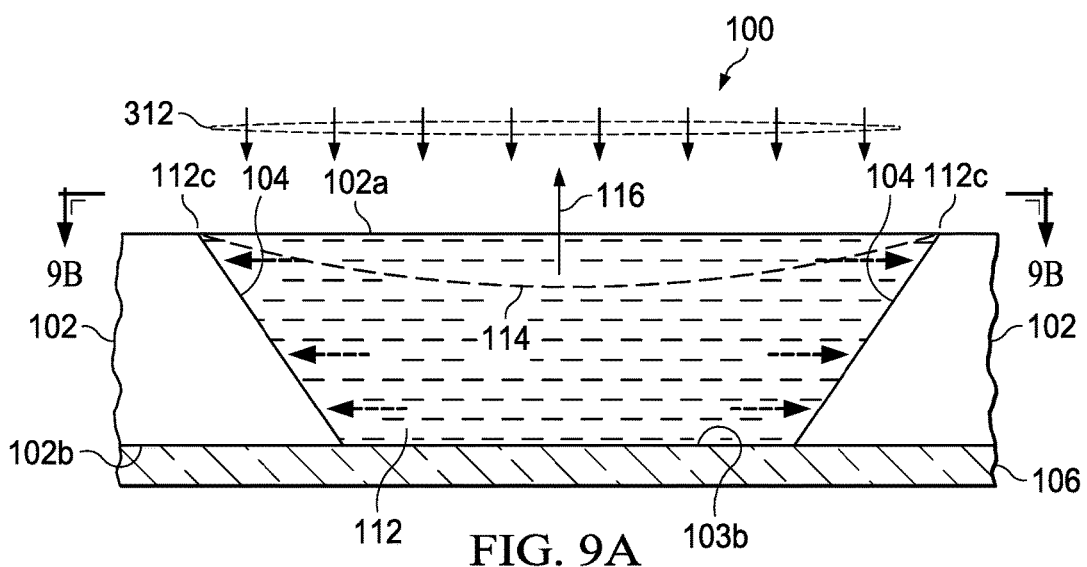
FIGS. 9A and 9B are partial side elevation and top plan views illustrating continuation of the drying process with continued edge contact pinning at the sidewalls and outward capillary flow of the aqueous solution from the center toward the sidewalls.
Figure 9B:
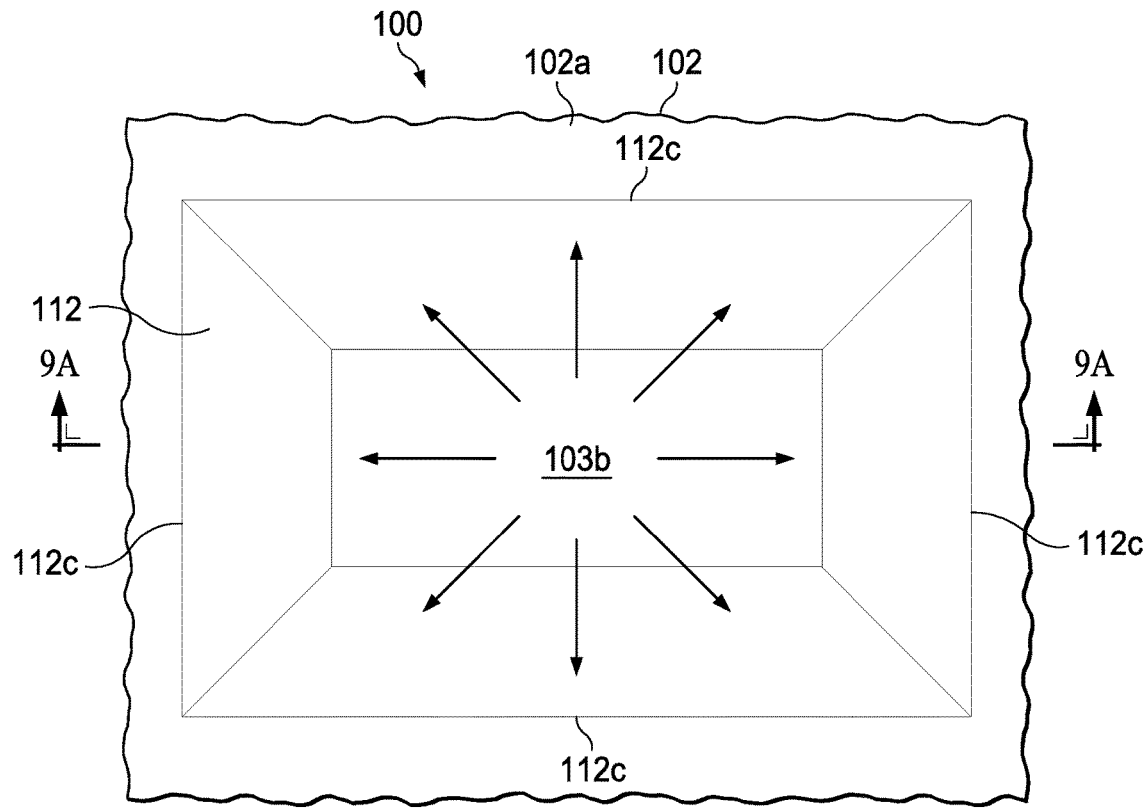
Figure 10A:
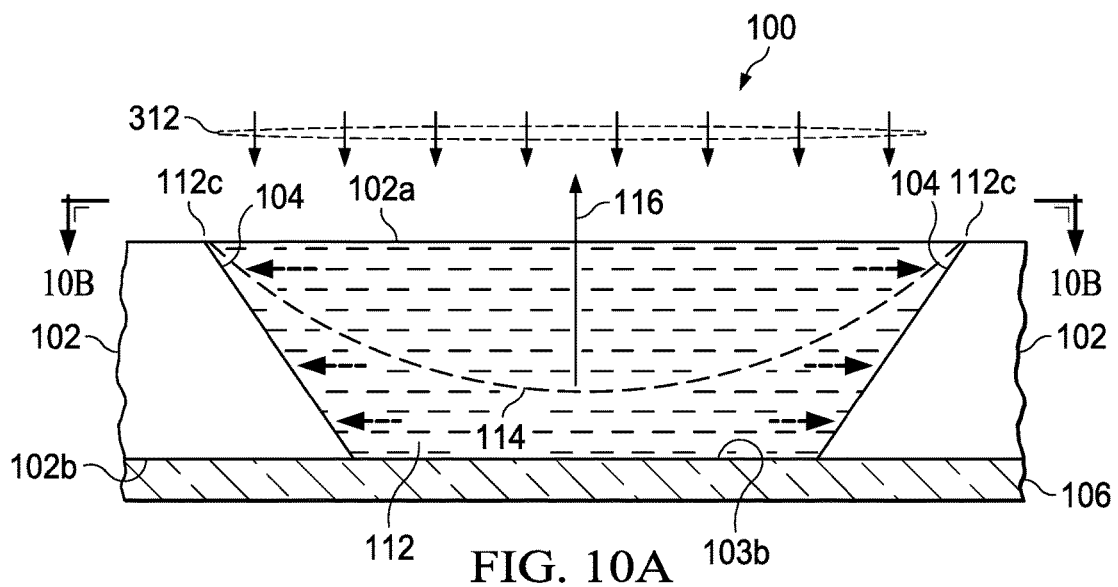
FIGS. 10A and 10B are partial side elevation and top plan views illustrating further evaporation of the aqueous solution.
Figure 10B:
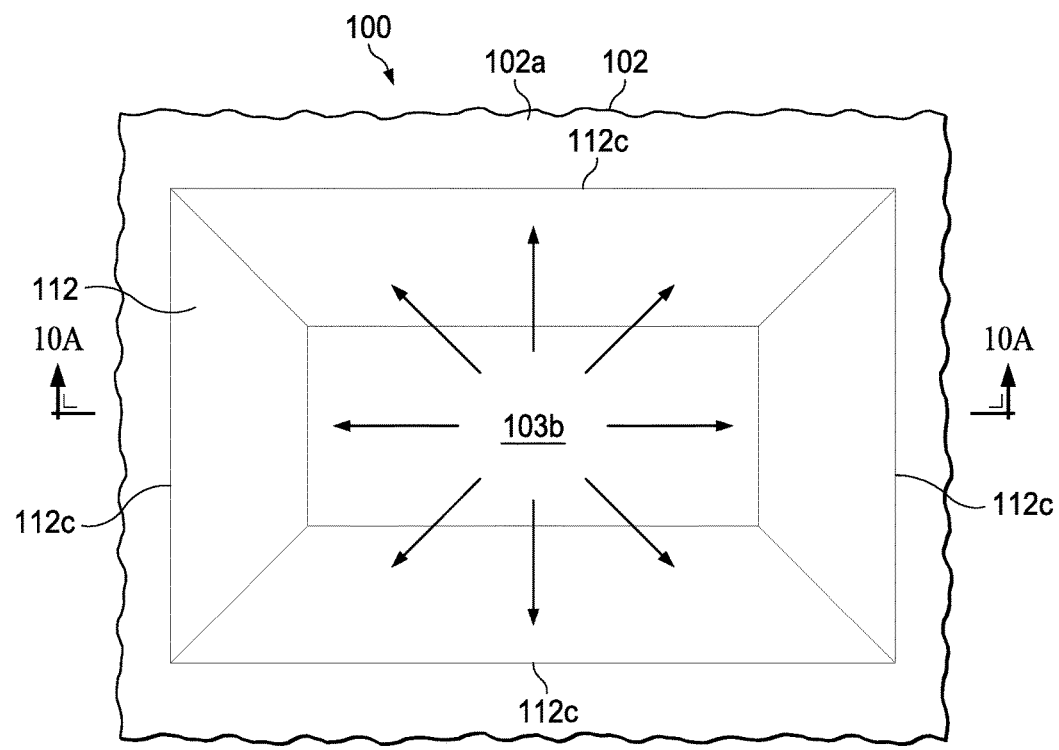

As the drying process 312 continues in FIGS. 9A and 9B, the preferential evaporation from the center at 116 causes a drop in the fluid level while the outward edges of the fluid 112 remain pinned at the sidewalls 104 along the contact line 112c through molecular pinning forces to the rough sidewall surfaces and fluid replenishment aided by the thermal gradient. As the temperature of the fluid 112 decreases from the sidewall edges 104 to the center at arrow 116, the solvation limits for solvated $CsN_3$ also decrease, so for the $CsN_3$ species to remain in its stable solvated state as a fluid solution 112, the process 312 provides a preferential migration via capillary fluid flow outward toward the warmer temperatures to at the sidewalls 104. This outward fluid migration allows the solution 112 to remain fully solvated until the capillary flow during the final stages of the solution drying can become the driving factor as shown in the continued drying processing in FIGS. 10A and 10B (further center fluid level drop).

Figure 11A:
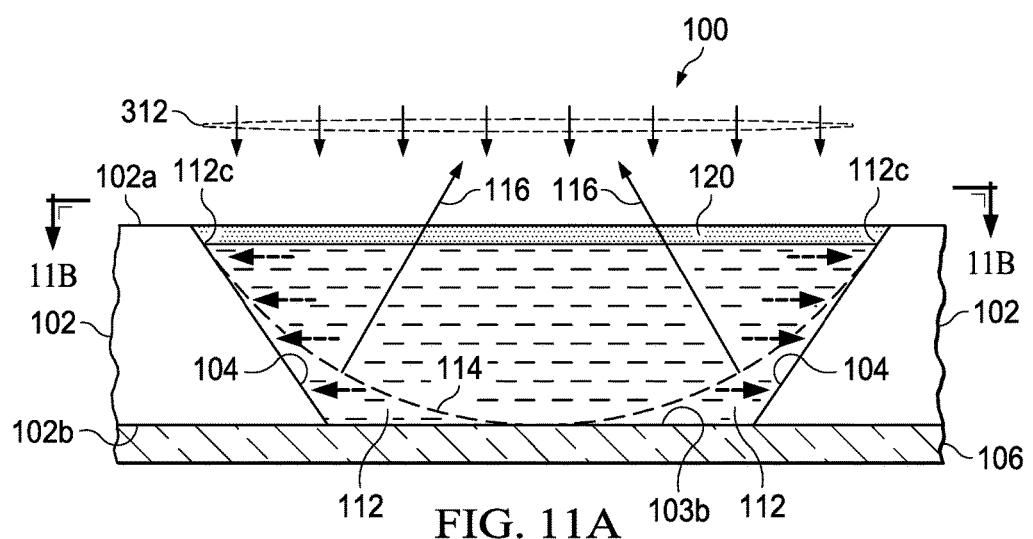
FIGS. 11A and 11B are partial side elevation and top plan views illustrating continuation of the drying process with a portion of the bottom cavity window exposed and continued outward capillary flow of the aqueous solution toward the sidewalls.
Figure 11B:
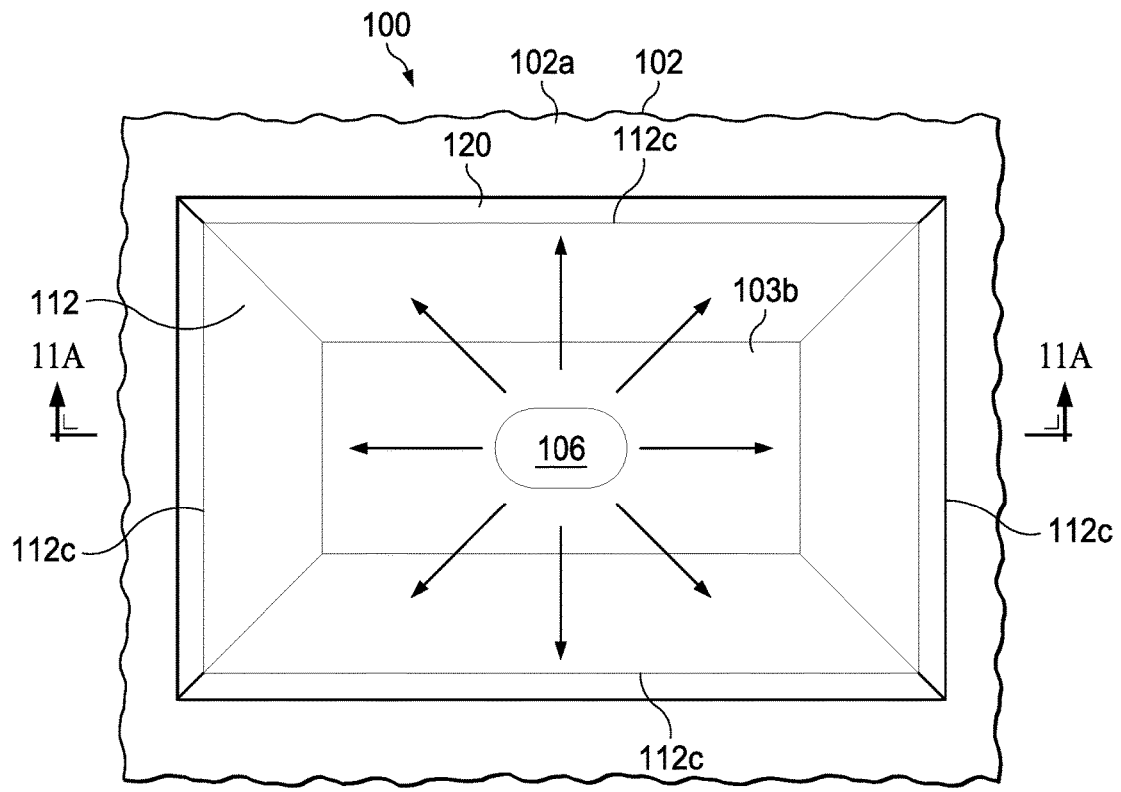

This continues until the center reaches the cavity bottom 103b, exposing a central portion of the lower glass window 106 as shown in FIGS. 11A and 11B. It is noted that the process 200 advantageously removes all or substantially all the fluid material from the center and the reduced fluid volume begins to reduce the vertical location of the pinned contact line 112c along the sidewalls 104. As seen in FIGS. 11A and 11B, the upper portions of the sidewalls 104 include dried dispersed aqueous solution material 120 (e.g., $CsN_3$) formed as a ring or band around the tops of the sidewalls 104. Suitable processes 312 can result in the initial exposure of the cavity bottom 103b either before, or after, or concurrently with, the initial downward movement of the edge pinning contact line 112c from the tops of the sidewalls 104.

Figure 12A:
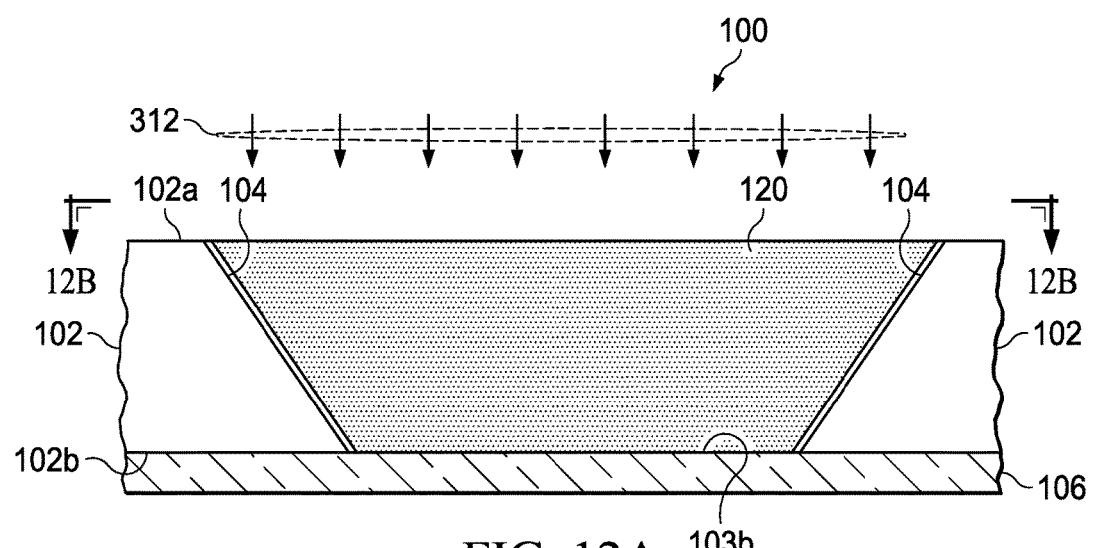
FIGS. 12A and 12B are partial side elevation and top plan views illustrating completion of the drying process with substantially all of the crystallized alkali metal material transferred to the cavity sidewalls.
Figure 12B:
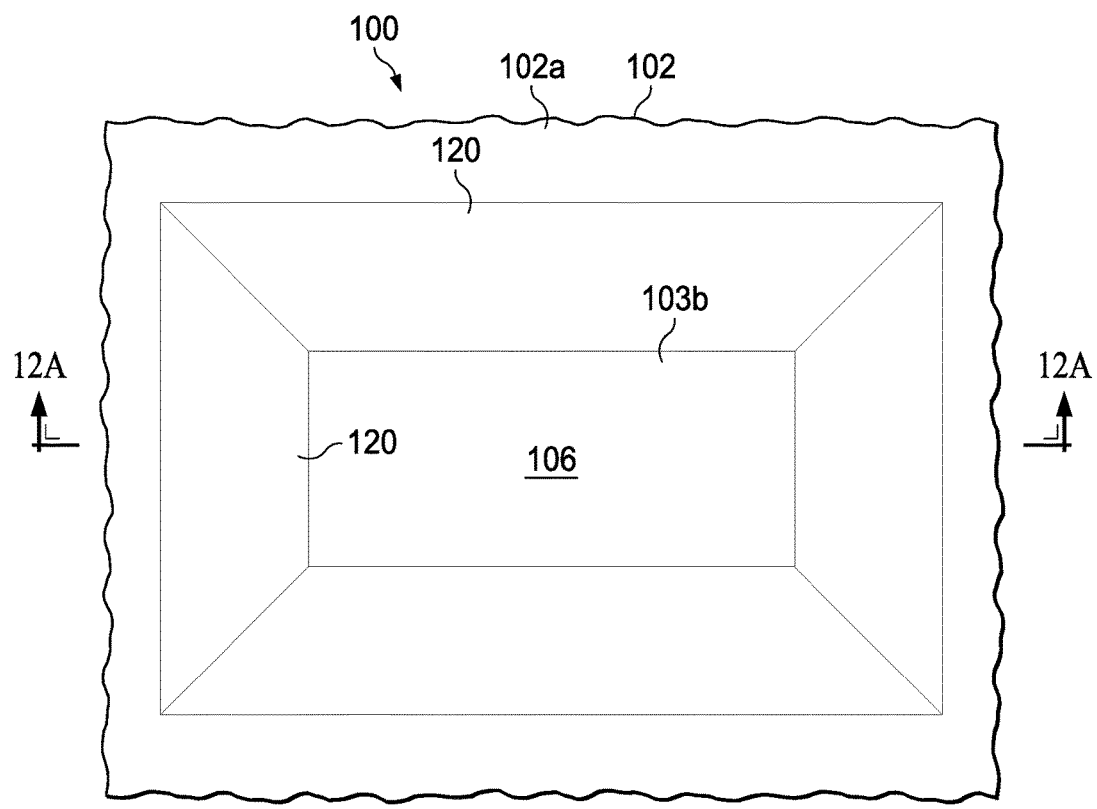

The drying process 312 is continued at 210 in FIG. 3 until the solution 112 is completely dried as shown in FIGS. 12A and 12B, where the dried material 120 (e.g., crystallized alkali metal material such as $CsN_3$) is formed substantially exclusively along the sidewalls 104, and little or no alkali material is found along the cavity bottom 103b. Thus, even if a certain amount of dried material 120 is found along the outer edges of the cavity bottom 103b (e.g., on the upper side of the lower glass window 106), $CsN_3$ solids 120 are localized to the vapor cell perimeter in the illustrated embodiment, outside the vapor cell active area used for an unobstructed optical channel.

The inventors have appreciated that complete or substantially complete cavity filling at 208 and control of the evaporation rate through the controlled temperature and relative humidity in the process 312 at 210 in FIG. 3 facilitates these transfer mechanisms to enhance the deposition of dried material 120 along the sidewalls 104, while mitigating or eliminating location of dried material 120 on the cavity bottom 103b. Suitable drying processes can be determined by evaporation rate control to advantageously balance the preferential center evaporation rate and thermal gradient-driven outward capillary flow for a given cell design in consideration of volume, cavity dimensions, aqueous solution mixture and other process and design variables.

In practice, the inventors have appreciated that excessive evaporation rates may inhibit the capacity for $CsN_3$ to remain sufficiently solvated until the capillary flow pulls the remaining fluid to the cell sidewalls 104, whereas too slow an evaporation rate reduces the temperature gradient leading to reduced localization of solid $CsN_3$ at the pinned interface. Non-limiting examples for drying $CsN_3$ include control of the process 312 at 46.1% relative humidity at 20.9° C. to form a generally open cavity bottom 103c, 48.1% relative humidity at 20.9° C. for a clear cavity bottom 103c with a visible ring of solid dried material 120 around the sidewall edge, 49% relative humidity at 20.5° C. for a relatively clear cell bottom 103c with some solid material formation 120, and 51.8% relative humidity at 20.9° C., with higher relative humidity settings at 51.8% at 20.9° C. resulting in a relatively clear so bottom 103c with sublimation occurring in the active cell area. Further increased relative humidity of 55.6% at 20.7° C. results in solid formation in the center of the cell bottom 103c, and still slower evaporation rates using a 60.8% relative humidity at 20.3° C. yields a hazy cell window with large amounts of sublimation of solid material 120 on the cell bottom 103c. Other suitable process conditions can be found for facilitating replenishment of liquid evaporating at 210 in FIG. 3 from the reservoir sidewall edges 104 by liquid from the reservoir interior through control of the preferential center evaporation rate to generate suitable thermal gradients during the drying process 312, where the resulting outward capillary flow can carry virtually all the dispersed material 120 within the cavity 103 to the sidewalls 104 before solidification.

Figure 13A:
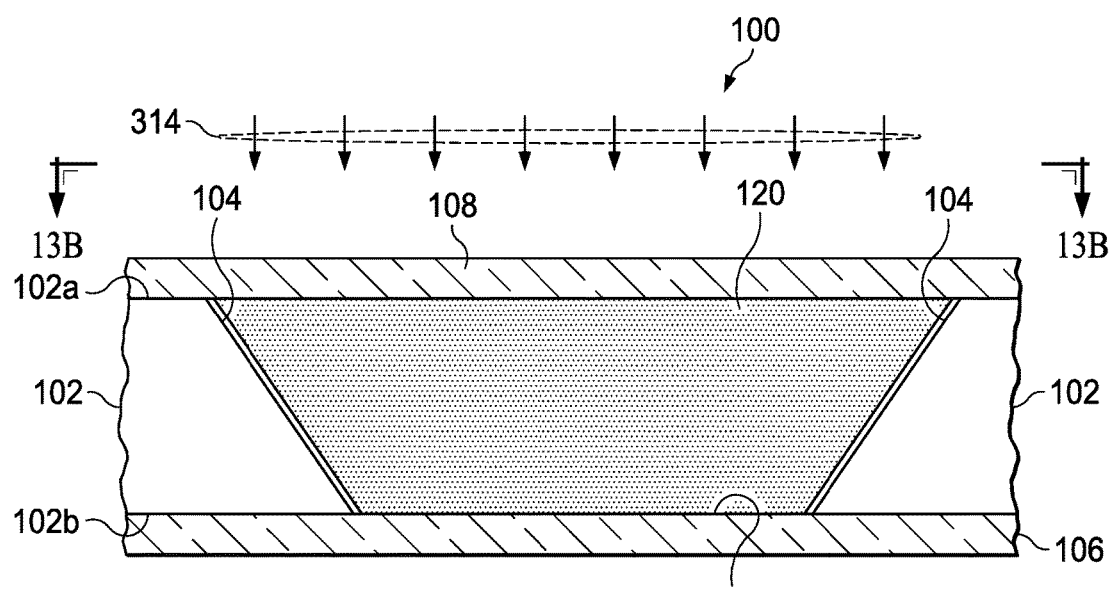
FIGS. 13A and 13B are partial sectional side elevation and top plan views illustrating bonding of an upper window to the top side of the substrate to seal the cavity.
Figure 13B:
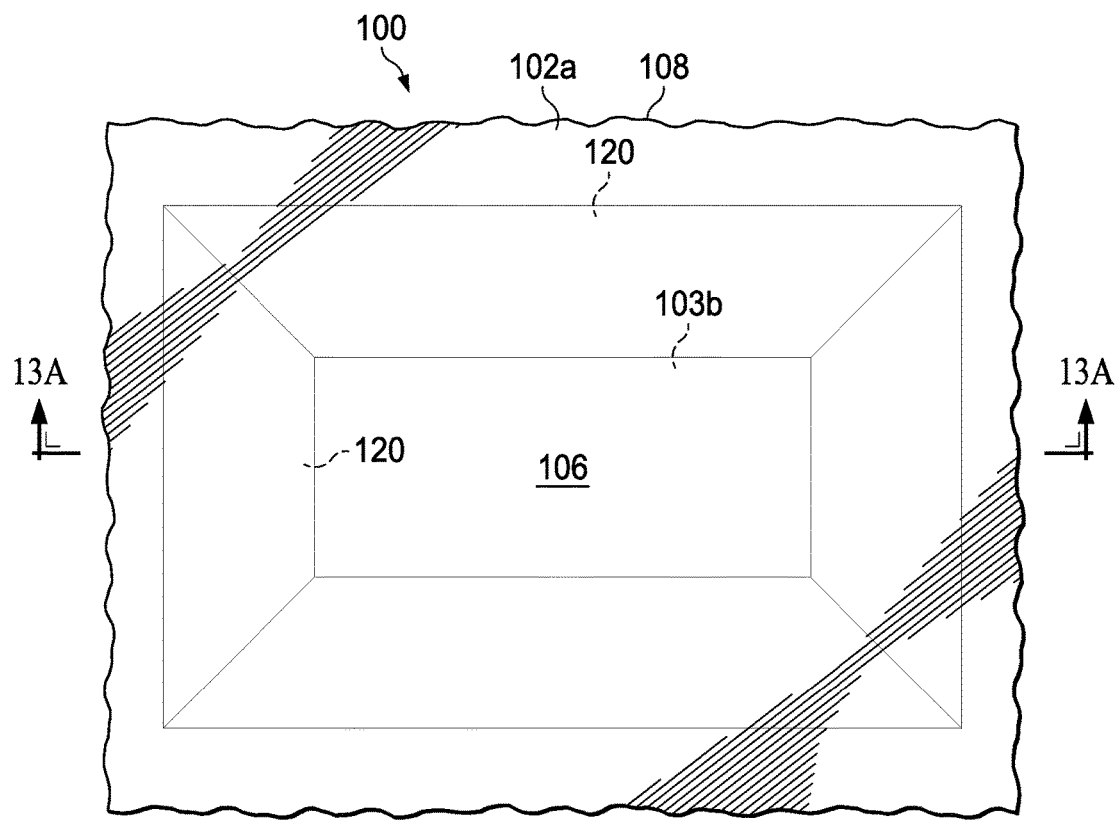
Figure 14A:
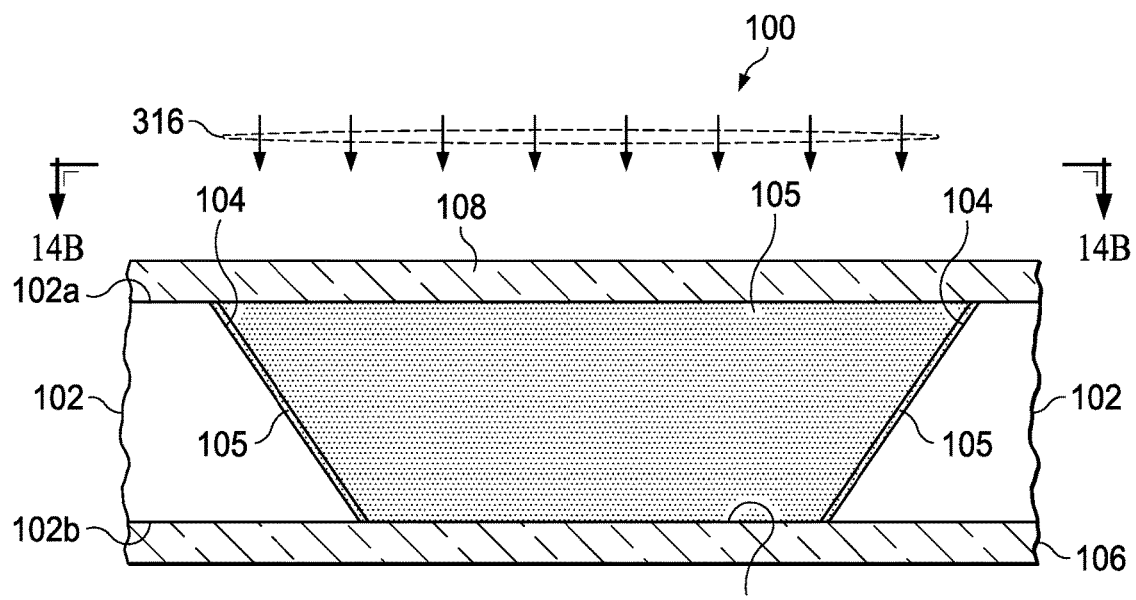
FIGS. 14A and 14B are partial sectional side elevation and top plan views illustrating exposure of the crystallized alkali metal material to photolysis to form an alkali metal gas in the sealed cavity.
Figure 14B:
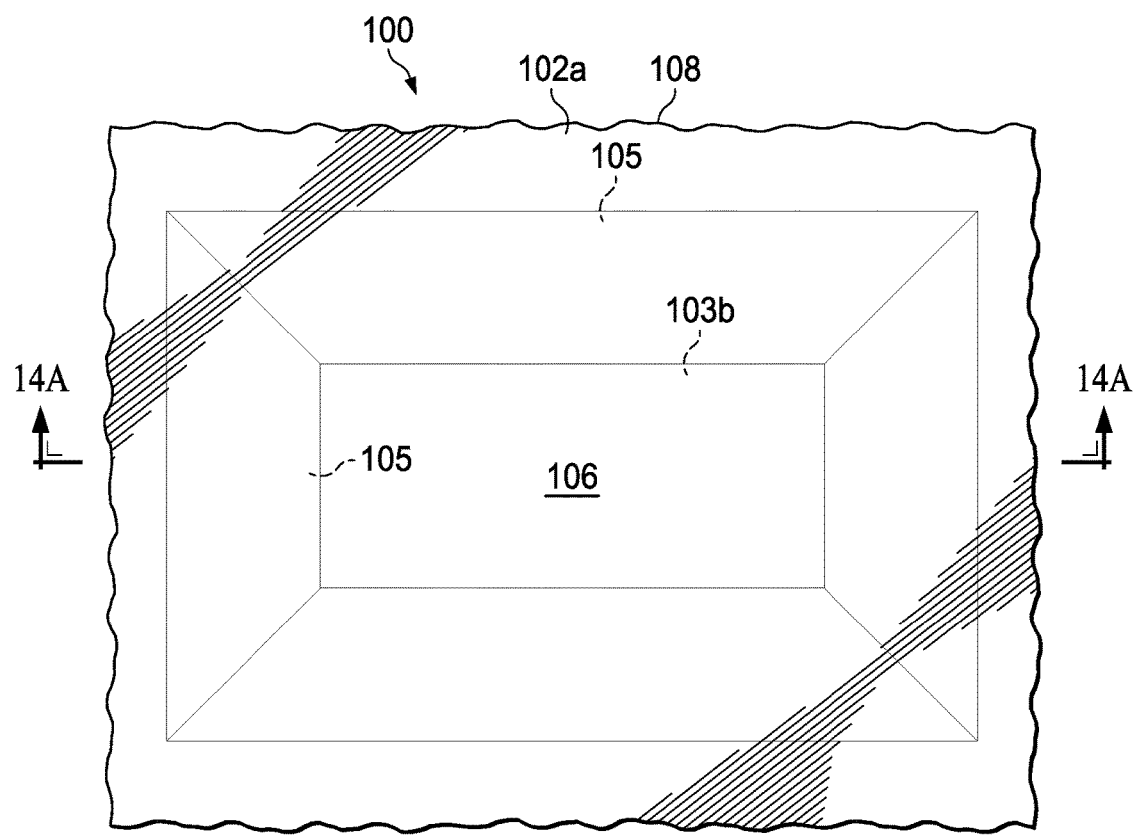

Continuing at 212 in FIG. 3, a transparent upper window 108 such as silicon glass is bonded to the first side 102a of the substrate 102 via a bonding process 314 as shown in FIGS. 13A and 13B in order to seal the cavity 103 using any suitable bonding technique, and the crystallized alkali metal material 120 is exposed to UV photolysis process 316 at 214 to form an alkali metal gas (e.g., Cs) in the sealed cavity 103, with crystallized alkali metal material 105 remaining on the sidewalls 104 as shown in FIGS. 14A and 14B. In a given process for concurrent fabrication of many cells 100, the products 100 are separated at 216 into individual dice to complete the process 200, leaving a vapor cell 100 as shown in FIGS. 1 and 2. As discussed above, the process 200 advantageously provides a novel, low-cost, method for fabrication of high-density Cs vapor cells 100 with complete filling and controlled drying facilitating self-assembly of $CsN_3$ solids along the perimeter sidewalls 104 outside the active area of a vapor cell 104 on a scale where direct manipulation is not possible. Other higher-cost solutions are available, but these require use of two inter-connected cells, one as $CsN_3$ reservoir cell, and one as laser interrogation cell, but this involves additional fabrication cost and complexity as well as significant increase in product size and material costs.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A method for fabricating a vapor cell, comprising:
   forming a cavity including at least one sidewall extending between first and second sides of a substrate;
   bonding a lower window to the second side of the substrate, wherein the lower window forms a cavity bottom;
   filling the cavity with an aqueous solution comprising an alkali metal material;
   drying the aqueous solution at a controlled temperature and humidity such that crystallized alkali metal material forms proximate the at least one sidewall and not substantially on the cavity bottom;
   bonding an upper window to the first side of the substrate, the upper window sealing the cavity; and
   exposing the crystallized alkali metal material to UV photolysis to form an alkali metal gas in the sealed cavity.

2. The method of claim 1, wherein forming the cavity comprises forming a unitary cavity separated by the at least one sidewall from any other cavity formed in the substrate.

3. The method of claim 2, wherein forming the cavity comprises performing an etch process to provide a surface texture on the at least one sidewall significantly rougher than a surface texture of the first side of the substrate.

4. The method of claim 3, wherein forming the cavity comprises performing an anisotropic etch process to form the at least one sidewall at a non-zero angle.

5. The method of claim 2, wherein the alkali metal material is Cesium Azide ($CsN_3$).

6. The method of claim 2, wherein forming the cavity comprises performing an anisotropic etch process to form the at least one sidewall at a non-zero angle.

7. The method of claim 1, wherein forming the cavity comprises performing an etch process to provide a surface texture on the at least one sidewall significantly rougher than a surface texture of the first side of the substrate.

8. The method of claim 7, wherein forming the cavity comprises performing an anisotropic etch process to form the at least one sidewall at a non-zero angle.

9. The method of claim 1, wherein forming the cavity comprises performing an anisotropic etch process to form the at least one sidewall at a non-zero angle.

10. The method of claim 1, wherein the alkali metal material is Cesium Azide ($CsN_3$).

11. A method of forming a vapor cell, comprising:
forming a cavity in a substrate defined by at least one sidewall extending between a first opening in a first side of the substrate and a second opening in a second side of the substrate, wherein the cavity is wider at the first opening than at the second opening, and
forming a crystallized alkali metal material on at least a portion of the at least one sidewall;
attaching a first window to the second side of the substrate, the first window forming a transparent cavity bottom substantially free of crystallized alkali metal material;
attaching a second window to the first side of the substrate, the second window sealing the cavity and form a transparent cavity top; and
creating an alkali metal gas in the sealed cavity from the crystallized alkali metal material.

12. The method of claim 11, wherein the at least one sidewall comprises a surface texture significantly rougher than a surface texture of the first side of the substrate.

13. The method of claim 12, wherein the at least one sidewall is at a non-zero angle relative to an axis extending between the first and second sides.

14. The method of claim 13, wherein substrate structure comprises only one cavity.

15. A method for fabricating a vapor cell, comprising:
forming a cavity including at least one sidewall extending between first and second sides of a substrate;
bonding a lower window to the second side of the substrate, the lower window forming a cavity bottom;
filling the cavity with an aqueous solution comprising an alkali metal material;
drying the aqueous solution at a controlled temperature and humidity such that a edge contact pinning of the aqueous solution at a pinned fluid interface between the aqueous solution and the at least one sidewall is substantially maintained and preferential evaporation of the aqueous solution occurs proximate a center of the lower window, wherein the drying results in crystallized alkali metal material formed proximate the at least one sidewall and not substantially on the cavity bottom;
bonding an upper window to the first side of the substrate, the upper window sealing the cavity; and
exposing the crystallized alkali metal material to UV photolysis to form an alkali metal gas in the sealed cavity.

16. The method of claim 15, wherein forming the cavity comprises performing an etch process to provide a surface texture on the at least one sidewall significantly rougher than a surface texture of the first side of the substrate.

17. The method of claim 15, wherein forming the cavity comprises performing an anisotropic etch process to form the at least one sidewall at a non-zero angle.

18. The method of claim 15, wherein the alkali metal material is Cesium Azide ($CsN_3$).

* * * * *